United States Patent
Nakashima

(10) Patent No.: US 6,208,406 B1
(45) Date of Patent: Mar. 27, 2001

(54) ENVIRONMENTAL CONTROL APPARATUS FOR EXPOSURE APPARATUS

(75) Inventor: Toshiharu Nakashima, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 08/825,398

(22) Filed: Mar. 28, 1997

(30) Foreign Application Priority Data

Mar. 29, 1996 (JP) .................................................. 8-104406

(51) Int. Cl.[7] .................................................. G03B 27/52
(52) U.S. Cl. .................................................. 355/30; 355/55
(58) Field of Search ....................................... 355/30, 55

(56) References Cited

U.S. PATENT DOCUMENTS

| | | | |
|---|---|---|---|
| 4,989,031 | * 1/1991 | Kamiya | 355/30 |
| 5,164,778 | * 11/1992 | Tanabe et al. | 355/215 |
| 5,559,584 | 9/1996 | Miyaji et al. | 355/73 |
| 5,633,698 | * 5/1997 | Imai | 355/72 |
| 5,666,187 | * 9/1997 | Kim | 355/30 |
| 5,831,770 | * 11/1998 | Matsuzawa | 359/649 |

* cited by examiner

*Primary Examiner*—Georgia Epps
*Assistant Examiner*—Tim Thompson
(74) *Attorney, Agent, or Firm*—Armstrong, Westerman, Hattori, McLeland & Naughton

(57) ABSTRACT

Disclosed is an environmental control apparatus for controlling a working environment in an exposure apparatus for effecting exposure using exposure light having a wavelength range in which oxygen absorbs the exposure light. The apparatus comprises an ozone removing filter for removing ozone in the air supplied to the exposure apparatus. By use of the environmental control apparatus of the present invention, ozone which is present in the air supplied to the exposure apparatus and absorbs the exposure light can be removed, so that a decrease in the amount of exposure light can be suppressed and hence, the amount of exposure light can be stabilized during exposure.

24 Claims, 1 Drawing Sheet

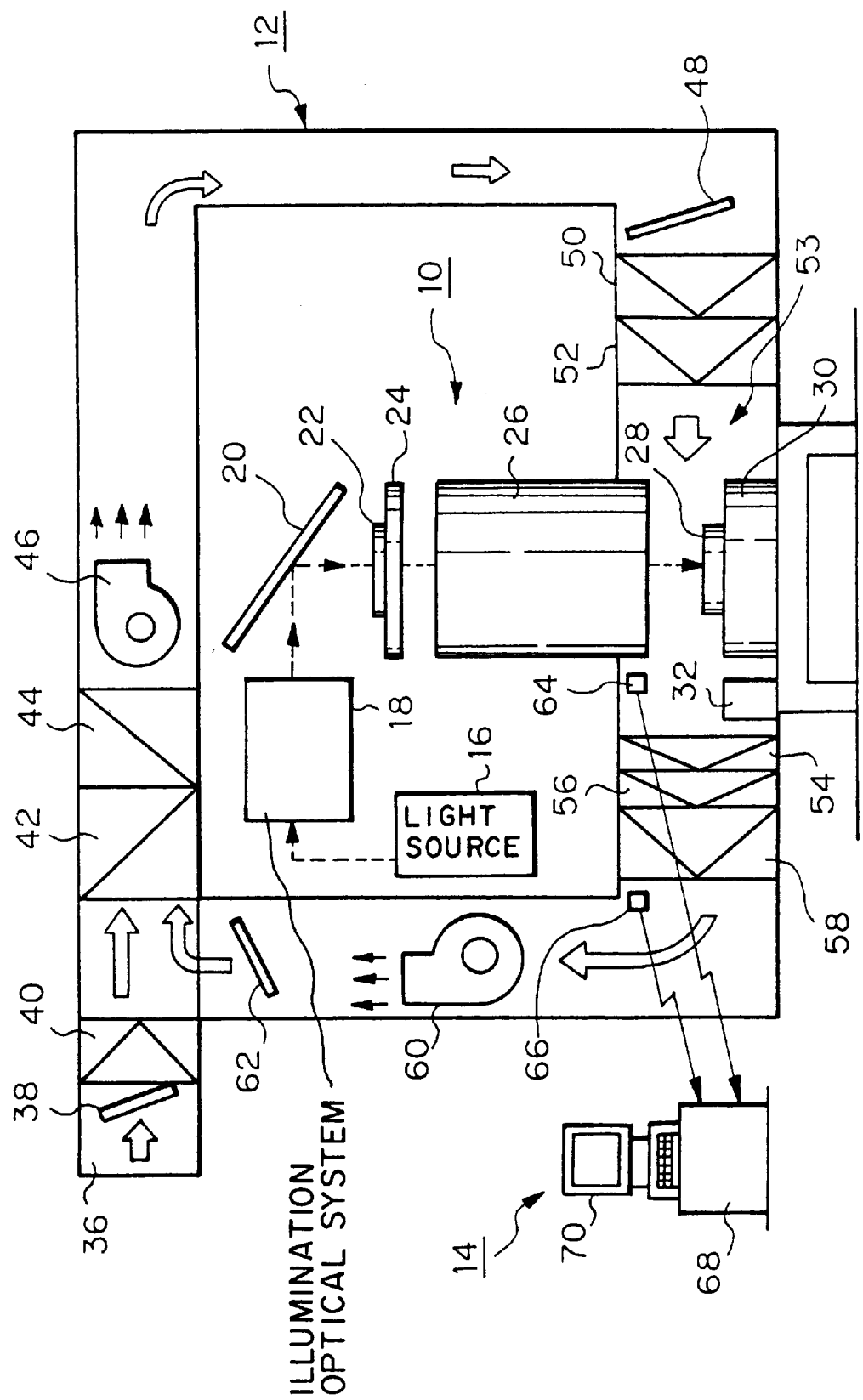

ENVIRONMENTAL CONTROL APPARATUS FOR EXPOSURE APPARATUS

BACKGROUND OF THE INVENTION

The present invention relates to an environmental control apparatus for controlling a working environment in an exposure apparatus. More particularly, the present invention is concerned with an environmental control apparatus for an exposure apparatus for effecting exposure using exposure light having a wavelength range in which oxygen absorbs the exposure light.

In recent years, it has been desired to produce highly integrated semiconductor circuits. In order to produce such semiconductor circuits, exposure apparatuses have been widely used in which a circuit pattern formed on a reticle as a mask is transferred to a photosensitive substrate. Hence, there have been increasing demands for an exposure apparatus which is capable of forming an image of high resolution. As a technique for producing highly integrated semiconductor circuits, there has been known a technique which utilizes, as exposure light, light having a short wavelength, such as a g-line or i-line light emitted from a mercury lamp, KrF excimer laser light and ArF excimer laser light. Especially, as a technique for producing a DRAM (Dynamic Random Access Memory) of 1G, a technique which utilizes ArF excimer laser light having a wavelength as short as 193 nm has been proposed.

However, when ArF excimer laser light having a wavelength of 193 nm is used as exposure light for producing highly integrated semiconductor circuits, problems arise, such that the amount of exposure light which reaches the photosensitive substrate decreases and, therefore, becomes unstable during exposure. The causes of the above-mentioned problems are as follows:

(1) Light having a short wavelength, such as ArF excimer laser light of 193 nm, is absorbed by oxygen in an atmosphere. That is, ArF excimer laser light has a spectral range which includes a specific wavelength range in which oxygen absorbs the ArF excimer laser light. Therefore, in an exposure apparatus in which ArF excimer laser light is used as exposure light, when exposure is effected in a normal atmosphere comprising air having an oxygen content of about 20%, ArF excimer laser light is absorbed by oxygen during exposure. Therefore, the amount of exposure light which reaches the photosensitive substrate decreases during exposure.

(2) When oxygen absorbs ArF excimer laser light, ozone is produced. Since ozone also absorbs ArF excimer laser light, the amount of exposure light which reaches the photosensitive substrate progressively decreases and therefore becomes unstable during exposure, leading to difficulty in monitoring the amount of exposure light for which highly precise measurements are required.

Accordingly, it is presumed that the above-mentioned problems accompanying a technique which utilizes exposure light having a short wavelength can be obviated by removing oxygen in an area including a light path in an exposure apparatus in a manner such that the area is purged with an inert gas and sealed, or an inert gas is continuously supplied to the area for removing oxygen.

However, when the removal of oxygen in an area including a light path is conducted in such a manner as mentioned above, there are various disadvantages as follows:

(1) When an area including a light path is completely sealed, it is difficult to load and unload a mask and a photosensitive substrate in the light path.

(2) When an area including a light path is adapted to be sealable using a gate for loading and unloading a mask and a substrate, which is provided in a carrying means for the mask and substrate, it is difficult to periodically perform maintenance for a substrate stage.

(3) A sealing structure which has a large internal volume and is very complicated is required, due to a large degree of motion of a substrate stage.

(4) It is difficult to form a sealing structure having a sufficient pressure resistance against a difference in pressure between the interior and exterior thereof.

(5) When light is transmitted through a sealing structure having a large internal volume, the temperature distribution in the sealing structure becomes non-uniform, so that it is difficult to control the temperature of the sealing structure.

SUMMARY OF THE INVENTION

In view of the above circumstances, a primary object of the present invention is to provide an environmental control apparatus for use in an exposure apparatus for effecting exposure using exposure light having a wavelength range in which oxygen absorbs the exposure light, which has a simple construction and which suppresses a decrease in the amount of exposure light, so that the amount of exposure light can be stabilized during exposure.

According to the present invention, there is provided an environmental control apparatus for controlling a working environment in an exposure apparatus for effecting exposure using exposure light having a wavelength range in which oxygen absorbs the exposure light, which comprises an ozone removing filter for removing ozone in the air supplied to the exposure apparatus.

According to one preferred embodiment of the present invention, the environmental control apparatus further comprises an air conditioning system having an air circulation passage for supplying air having a controlled temperature to the exposure apparatus and the ozone removing filter is disposed in the air circulation passage of the air conditioning system.

According to another preferred embodiment of the present invention, the environmental control apparatus further comprises ozone concentration detection sensors which are disposed upstream and downstream of the ozone removing filter in a flowing direction of the air supplied to the exposure apparatus, and a device for detecting a degree of clogging of the ozone removing filter on the basis of outputs from the ozone concentration detection sensors.

When the environmental control apparatus of the present invention which comprises an ozone removing filter is used for an exposure apparatus for effecting exposure using exposure light having a wavelength range in which oxygen absorbs the exposure light, undesirable ozone which is produced from oxygen and absorbs the exposure light can be removed by the ozone removing filter. Therefore, the environmental control apparatus of the present invention is advantageous in that a decrease in the amount of exposure light can be suppressed and, therefore, the amount of exposure light can be stabilized during exposure. By use of the environmental control apparatus of the present invention, it has become unnecessary to form in the exposure apparatus a sealing structure for sealing an area including a light path. Therefore, the above-mentioned disadvantages accompanying a technique which utilizes a sealing structure (such as difficulties in loading and unloading a mask and a photosensitive substrate, performing maintenance, controlling a temperature of the sealing structure and the like) can be obviated. Although oxygen is relatively stable in a normal atmosphere and difficult to remove using a filter, ozone created by exposure light is relatively unstable in the same atmosphere and is highly reactive, so that it can be readily removed using a filter.

Since ozone has an adverse effect on a photoresist on the photosensitive substrate, the environmental control apparatus of the present invention is also advantageous in that an adverse effect on the photoresist due to ozone can be suppressed.

BRIEF DESCRIPTION OF THE DRAWING

FIG. 1 is a schematic illustration showing a system comprising an exposure apparatus which utilizes a preferred embodiment of the environmental control apparatus according to the present invention.

DETAILED DESCRIPTION OF PREFERRED EMBODIMENTS

Hereinbelow, an embodiment of the present invention is described in detail, with reference to FIG. 1. In this embodiment, the environmental control apparatus of the present invention is employed for a projection exposure apparatus for producing semiconductor integrated circuits.

FIG. 1 is a schematic illustration showing a projection exposure apparatus system which utilizes a preferred embodiment of the environmental control apparatus according to the present invention. The system generally comprises a projection exposure apparatus 10, an air conditioning system 12 having an air circulation passage for controlling a working environment in the projection exposure apparatus 10 and a control system 14. The projection exposure apparatus 10 comprises a light source 16 for emitting exposure light, such as ArF excimer laser light; a reticle 22 having a predetermined pattern formed thereon (not shown); an illumination optical system 18 for transmitting the exposure light emitted from the light source 16 to the reticle 22; a mirror 20 for guiding the transmitted exposure light from the optical system 18 to the reticle 22; a reticle stage 24 for receiving and shifting the reticle 22; a projection optical system 26 for projecting to a wafer 28 an image of the predetermined pattern (not shown) formed on the reticle 22; a wafer stage 30 for receiving and shifting the wafer 28; and a wafer loader 32 for loading the wafer 28 onto the wafer stage 30. The light source 16 is not limited to that for emitting ArF excimer laser. Any light sources can be employed, as long as they emit exposure light having a wavelength range in which oxygen absorbs the exposure light.

As shown in FIG. 1, in the projection exposure apparatus 10, ArF excimer laser light as exposure light is emitted from the light source 16 and controlled by the illumination optical system 18 so as to have a predetermined illuminance range and a predetermined illuminance distribution. The resultant exposure light is transmitted to the reticle 22 having a predetermined pattern. The exposure light passes through the reticle 22 and reaches the wafer 28 on the wafer stage 30 through the projection optical system 26, to thereby form an image of the predetermined pattern of the reticle 22 on the wafer 28. The wafer 28 is shifted in the X and Y directions by the wafer stage 30. (The left and right direction in FIG. 1 is defined as the "X" direction, and the vertical direction relative to the plane of FIG. 1 is defined as the "Y" direction.) By the motion of the wafer 28, an image of the predetermined pattern of the reticle 22 can be transferred to a predetermined portion of the wafer 28. After completion of exposure of the wafer 28, the exposed wafer 28 is removed for replacement from the wafer stage 30 by the wafer loader 30.

The air conditioning system 12 is adapted to effect air conditioning around the wafer stage 30 in the projection exposure apparatus 10. The air circulation passage of the air conditioning system 12 is substantially blocked from the outside. In the air conditioning system 12, air is introduced from an air supply opening 36. After controlling the flow rate of air by an air damper 38, the air flows through a chemical filter 40, which removes impurities in the air which have an adverse effect on exposure. Subsequently, the air passes through a cooler 42 and a heater 44. After controlling the temperature of air by the cooler 42 and the heater 44, and precisely controlling the flow rate of air to a predetermined value by a fan 46 and a damper 48, the air then flows through a chemical filter 50, which again removes impurities in the air. Then, the air flows through a ULPA filter 52, which removes fine particles in the air, and passes through a wafer stage chamber 53 including the wafer stage 30 on which the wafer 28 rests.

Subsequently, the air flows through a ULPA filter 54 and a chemical filter 56, and reaches an ozone removing filter 58 which is disposed downstream of the wafer stage chamber 53 as viewed in the flowing direction of the air. Ozone is produced during exposure in the wafer stage chamber 53. The ozone is removed by the ozone removing filter 58. The ozone removing filter 58 comprises materials, typically, such as active carbon, ion-exchange resins, and so on. However, various materials can be employed as long as they adsorb the ozone. The ULPA filter 54 which is disposed upstream of the ozone removing filter 58 is advantageously used in the case of the ozone removing filter 58 being made of a material which releases fine particles. The chemical filter 56 which is also disposed upstream of the ozone removing filter 58 is advantageously used in the case of the ozone removing filter 58 being made of a material which releases a chemical substance having an adverse effect on exposure. The flow rate of air, after it flows through the ozone removing filter 58, is controlled by a fan 60 and a damper 62. The air is then returned to the cooler 42, so that recirculation of air is effected.

Ozone concentration detection sensors 64, 66 are, respectively, disposed upstream and downstream of the ozone removing filter 58 to detect ozone concentrations in the air before and after the air flows through the ozone removing filter 58. The ozone concentration detection sensors 64, 66 are connected to a control apparatus 68 in the control system 14. The control apparatus 68 detects a degree of clogging of the ozone removing filter 58 by making a comparison between outputs from the ozone concentration detection sensors 64, 66, to thereby determine a timing of replacement of the ozone removing filter 58. The control apparatus 68 is connected to a monitor 70. Information supplied from the control apparatus 68, such as a timing of replacement of the ozone removing filter 58, is indicated by the monitor 70. The control apparatus 68 also detects an amount of exposure light, and controls an output of the light source 16, based on the detected amount of exposure light.

According to the above-mentioned embodiment of the present invention, the ozone which absorbs the exposure light can be removed by the ozone removing filter 58 which is disposed in the air circulation passage of the air conditioning system. Therefore, a decrease in the amount of exposure light can be effectively suppressed, so that the amount of exposure light can be stabilized during exposure and hence, the amount of exposure light can be precisely detected by the control apparatus 68. Further, an adverse effect on a photoresist on the wafer 28 due to the ozone can be suppressed.

The present invention has been described above, with reference to one embodiment thereof. However, the present invention is not limited to the above-mentioned embodiment. Various embodiments are possible without departing from the scope of the present invention as defined in the appended claims. For example, the environmental control apparatus of the present invention can be applied to not only the air circulation system between the projection optical system 26 and the wafer 28 as shown in FIG. 1, but also an air circulation system between the illumination optical system 18 and the reticle 22, or between the reticle 22 and the projection optical system 26. Ozone removing filters may be disposed in the illumination optical system 18 at a site in the vicinity of a mobile reticle blind (not shown) disposed in a conjugate relationship to the reticle 22 and at a site in the vicinity of a revolver (not shown) for controlling a stop according to a σ value of the illumination optical system 18.

The environmental control apparatus of the present invention is advantageously used when laser light having a relatively broad spectral range is utilized as exposure light. This is because when a light source which emits light having a very narrow spectral range is used as the light source 16, it is possible to select and utilize, as exposure light, light having a wavelength which is outside the wavelength ranges in which oxygen and ozone absorb the exposure light. However, the environmental control apparatus of the present invention may be used when exposure light having a narrow spectral range is utilized. Further, the environmental control apparatus of the present invention is advantageously used for an exposure apparatus in which higher harmonics from a solid laser or light from a discharge lamp is utilized as exposure light. Additional filters may be used for removing a gas other than ozone, if exposure light used has a wavelength range in which the gas absorbs the exposure light.

What is claimed is:

1. An environmental control apparatus for controlling a working environment in an exposure apparatus comprising:
    an ozone removing filter disposed in a flow path of gas supplied to the exposure apparatus to remove at least ozone produced by exposure light.

2. The environmental control apparatus according to claim 1, further comprising:
    a gas conditioning system having a gas circulation passage, wherein
    said exposure apparatus is supplied with a gas having a controlled temperature, and said ozone removing filter is disposed in said gas circulation passage of the gas conditioning system.

3. The environmental control apparatus according to claim 2, further comprising:
    ozone concentration detection sensors which are respectively disposed upstream and downstream of said ozone removing filter in a flowing direction of the gas supplied to said exposure apparatus, and
    a device coupled to the ozone concentration detection sensors to detect a condition of said ozone removing filter on the basis of outputs from said ozone concentration detection sensors.

4. The environmental control apparatus according to claim 2, wherein said exposure apparatus comprises:
    an illumination optical system disposed in an exposure light path to transmit said exposure light to a reticle, to thereby form an image of a predetermined pattern on said reticle;
    a projection optical system disposed in the exposure light path to transfer said image to a wafer;
    a wafer stage disposed in an image plane side of a projection optical system to receive said wafer; and
    a wafer stage chamber including said wafer stage, and wherein said gas circulation passage of the gas conditioning system runs through an area in said wafer stage chamber between said projection optical system and said wafer stage.

5. The environmental control apparatus according to claim 4, wherein said ozone removing filter is disposed downstream of said wafer stage chamber in the flowing direction of the gas supplied to said exposure apparatus.

6. The environmental control apparatus according to claim 5, further comprising:
    a fine particles removing filter disposed upstream of said ozone removing filter in the gas flowing direction.

7. The environmental control apparatus according to claim 6, further comprising a chemical filter which removes impurities disposed upstream of said ozone removing filter in the gas flowing direction.

8. The environmental control apparatus according to claim 7, wherein said chemical filter is disposed between said ozone removing filter and said fine particles removing filter.

9. An exposure apparatus for forming an image on an object by exposure light from a light source comprising:
    a wafer stage disposed in an image plane side of a projection optical system to receive a wafer to be exposed to said exposure light; and
    a gas conditioning system disposed in the exposure apparatus to supply a gas between said light source and said wafer stage, said gas conditioning system including an ozone removing filter disposed in the gas flow path to remove at least the ozone produced by said exposure light.

10. An exposure apparatus comprising:
    an illumination optical system disposed in an exposure light path to transmit said exposure light to a reticle having a pattern formed thereon;
    a projection optical system disposed in the exposure light path to transfer an image of the pattern to a wafer;
    a wafer stage disposed in an image plane side of a projection optical system to receive said wafer; and
    a gas conditioning system disposed in the exposure apparatus to supply a gas between a light source and said wafer stage, said gas conditioning system including an ozone removing filter disposed in a flow path of the gas to remove at least ozone produced by said exposure light.

11. An exposure apparatus for forming an image on an object by exposure light from a light source comprising:
    an ozone removing filter disposed in a flow path of at least ozone produced by the exposure light, the ozone removing filter being adapted to remove the ozone.

12. An exposure apparatus according to claim 11, wherein the ozone is produced in an area including a light path of the exposure light during formation of an image on the object by the exposure light.

13. An exposure apparatus according to claim 11, wherein the exposure light has a wavelength range in which oxygen absorbs the exposure light.

14. An exposure apparatus according to claim 11, further comprising:
    an illumination optical system disposed in the exposure light path to transmit the exposure light emitted from the light source to a mask, the mask having a pattern formed theron;

a projection optical system disposed in the exposure light path to transfer an image of the pattern to the object, and a stage disposed in an image plane side of the projection optical system to receive a wafer, the stage being adapted to receive the object on the receiving surface, wherein the area is a stage chamber disposed between the projection optical system and the stage.

15. An exposure apparatus according to claim 12, further comprising:

an illumination optical system disposed in the exposure light path to transmit the exposure light emitted from the light source to a mask; and a projection optical system disposed in the exposure light path to transfer an image of the pattern to the object, wherein the area is an area between the projection optical system and the object.

16. An exposure apparatus according to claim 11, wherein at least one of a particle removing filter adapted to remove particles and a chemical filter adapted to remove impurities is disposed upstream of the ozone removing filter.

17. An exposure apparatus according to claim 12, further comprising a gas conditioning system adapted to condition the area, wherein the ozone flow path is a gas circulation passage formed by the gas conditioning system and the ozone removing filter is disposed in the gas circulation passage.

18. An exposure apparatus according to claim 17, wherein the ozone removing filter is disposed in the gas circulation passage downstream of the area.

19. An exposure apparatus according to claim 17, further comprising an ozone concentration detection sensor disposed in the ozone flow path to detect a concentration of the ozone.

20. An exposure apparatus for forming an image on an object by exposure light from a light source comprising:

an ozone concentration detection sensor disposed in a flow path of at least ozone produced by exposure light, the ozone concentration detection sensor being adapted to detect a concentration of the ozone.

21. An environmental control apparatus for controlling a working environment in an exposure apparatus which forms an image on an object by exposure light from a light source comprising:

an ozone removing filter disposed in a flow path of a gas supplied to an area including the light path of the exposure light, the ozone removing filter being adapted to remove at least ozone produced by the exposure light.

22. An environmental control apparatus according to claim 21, wherein the ozone is produced during formation of an image on the object by the exposure light.

23. An environmental control apparatus according to claim 21, wherein the exposure light has a wavelength range in which oxygen absorbs the exposure light.

24. An environmental control apparatus according to claim 21, further comprising a gas conditioning system adapted to condition the area, wherein the gas flow path is a gas circulation passage formed by the gas conditioning system and the ozone removing filter is disposed in the gas circulation passage.

* * * * *